(12) United States Patent
Hubbard et al.

(10) Patent No.: US 11,764,322 B2
(45) Date of Patent: Sep. 19, 2023

(54) BETAVOLTAICS WITH ABSORBER LAYER CONTAINING COATED SCINTILLATING PARTICLES

(71) Applicant: BATTELLE MEMORIAL INSTITUTE, Richland, WA (US)

(72) Inventors: Lance R. Hubbard, Richland, WA (US); Gary J. Sevigny, Richland, WA (US); Radha K. Motkuri, Richland, WA (US)

(73) Assignee: BATTELLE MEMORIAL INSTITUTE, Richland, WA (US)

(*) Notice: Subject to any disclaimer, the term of this patent is extended or adjusted under 35 U.S.C. 154(b) by 400 days.

(21) Appl. No.: 17/206,469

(22) Filed: Mar. 19, 2021

(65) Prior Publication Data

US 2021/0328086 A1    Oct. 21, 2021

Related U.S. Application Data

(60) Provisional application No. 62/992,452, filed on Mar. 20, 2020.

(51) Int. Cl.
| | | |
|---|---|---|
| G21H 1/02 | (2006.01) | |
| H01L 31/055 | (2014.01) | |
| C09K 11/61 | (2006.01) | |
| C09K 11/02 | (2006.01) | |
| H01L 31/0693 | (2012.01) | |
| G21H 1/12 | (2006.01) | |

(52) U.S. Cl.
CPC .......... *H01L 31/055* (2013.01); *C09K 11/025* (2013.01); *C09K 11/616* (2013.01); *G21H 1/02* (2013.01); *G21H 1/12* (2013.01); *H01L 31/0693* (2013.01)

(58) Field of Classification Search
CPC ..... H01L 31/055; H01L 31/0693; G21H 1/02; G21H 1/12
USPC ........................................................ 310/303
See application file for complete search history.

(56) References Cited

U.S. PATENT DOCUMENTS

| | | | |
|---|---|---|---|
| 2011/0220194 A1* | 9/2011 | Kurtin | C09K 11/565 |
| | | | 136/256 |
| 2018/0035511 A1* | 2/2018 | Chen | H05B 41/2926 |
| 2018/0138340 A1* | 5/2018 | Kurtin | C09K 11/565 |
| 2018/0158561 A1* | 6/2018 | Fenner | H01L 31/0352 |
| 2020/0212240 A1* | 7/2020 | Brovelli | H01L 31/055 |
| 2022/0238244 A1* | 7/2022 | Jones | C08K 3/16 |

FOREIGN PATENT DOCUMENTS

CN    114242821 A  *  3/2022

\* cited by examiner

*Primary Examiner* — Christopher M Raabe
(74) *Attorney, Agent, or Firm* — Derek H. Maughan

(57) ABSTRACT

A beta-voltaic device made up of silica covered scintillating particles incorporated within an isotope absorbing layer to produce an improved power source. Lost beta particles are converted to UV light which is also converted to power in a beta-voltaic converter. The addition of the scintillating particles effectively increases the power efficiency of a BV device while maintaining the slim profile and smaller size of the power source. This arrangement makes possible implementation in space, defense, intelligence, medical implants, marine biology and other applications.

19 Claims, 3 Drawing Sheets

BETAVOLTAICS WITH ABSORBER LAYER CONTAINING COATED SCINTILLATING PARTICLES

PRIORITY

This application claims priority from and incorporates by reference in its entirety U.S. Provisional Patent Application No. 62/992,452 entitled Betavoltaics from COTS: Enhanced Tritium Absorber Layer with Scintillating Particles filed by the same inventors on Mar. 20, 2020.

FEDERALLY-SPONSORED RESEARCH AND DEVELOPMENT

This invention was made with Government support under Contract DE-AC0576RL01830 awarded by the U.S. Department of Energy. The Government has certain rights in the invention.

BACKGROUND

Betavoltaic (BV) batteries are small on-chip power sources that allow for small sensor platforms to operate for decades. While advantageous in many aspects, BV devices tend to be inefficient power converts. This is believed in part to be due to poor extraction of the radiation from the source. A cousin technology called beta photovoltaics (BPV) tend to be more efficient than betavoltaics BVs, but typically requires a much larger size to obtain a comparable power output. Integrating these two types of devices could provide a number of advantages however attempts thus far have fallen short for a variety of reasons.

The following pages describe examples of a novel device that takes advantage of silica covered scintillating particles incorporated into an isotope absorbing layer to produce an improved power device. In a typical conventional layer, only around 16% of the beta particles make it out of the absorber for collection as a power source. The addition of the silica coated scintillation particles converts the lost beta particles into UV-light, which can then be emitted and collected as power by a semiconductor. Power enhancement of 5-43% can be achieved by the addition of such particles.

Additional advantages and novel features of the present disclosure will be set forth as follows and will be readily apparent from the descriptions and demonstrations set forth herein. Accordingly, the following descriptions of the present disclosure should be seen as illustrative of the disclosure and not as limiting in any way.

SUMMARY

The present application describes a beta voltaic device made up of silica covered scintillating particles incorporated within an isotope absorbing layer to produce an improved power source. In one embodiment this arrangement was developed and deployed to collect lost beta particles and convert them to UV light which is also converted to power in a beta voltaic converter. The addition of the scintillating particles effectively increases the power efficiency of a BV device while maintaining the slim profile of the power source and providing greater energy capacity in smaller-sized devices than are currently used. Further benefits of this design include increased radiation hardness by absorption of the betas and mitigation of the excess energy leading to a reduced need for excess energy shielding. In addition, a greater number of isotopes to be used as fuel sources because of this design and structure. Various shapes and configurations of such devices may find applications in space, defense, intelligence, medical implants, marine biology and other applications.

While various examples of such devices have been provided, a variety of other materials and examples are also contemplated and can provide tailored implementations based upon the particularized needs of a user. For example, a number of scintillators and scintillating materials are recited including BaF2, Br—La—Ce-Halides (Cl, Br, etc), Perovskites, inorganics and any of those shown at the following link http://scintillator.lbl.gov/ can be utilized depending upon the needs and necessities of the user. (The contents of the materials indicated at these links are incorporated by reference into this application.) However, these listings of materials are exemplary and not exclusive.

In addition, sample semiconductors which might be included depending upon the needs of the user include, but are not limited to CVD-Diamond, SiC, GaN, GaP, PbO, CdS, CdTe, ZnS, GaAs, InGaAs, Si, Ge, PbS, InSb, InGaP, AlInP, AlGaN, AlN, Ga2O3, BN, Metal-organic frameworks (MOFs), covalent organic frameworks (COFs), composites, Perovskites Both, Organic and Inorganic as well as those shown at the following locations https://aip.scitation.org/doi/10.1063/1.1656484; https://www.nature.com/articles/s41598-019-47371-6. The contents of these sites are also incorporated by reference. This listing is also provided as exemplary and not exclusive or limiting.

Materials in the adsorbing layer may be specifically arranged and configured for isotopes including but not limited to Tritium, Si-32, P-32, P-33, S-35, Sc-46, Co-60, Ni-63, Kr-85, Sr-90/Y-90, Ru-106, Cs-134, Cs-137, Ce-144, Pm-147, Tb-160, Tm-170, Au-198, Th-204 and combinations thereof may also be utilized. The silica covering can be glass in certain embodiments and configurations but may also be provided in other arrangements and configurations as well.

In some specific embodiments, a beta voltaic device is made up of silica covered scintillating particles incorporated within a tritiated water isotope absorbing layer to produce an improved power source. The scintillating particles may be selected from the group consisting of BaF2, Br—La—Ce-Halides, Perovskites Inorganic, and combinations thereof. The silica covering maybe glass. A semiconductor is selected from the group consisting of CVD-Diamond, SiC, GaN, GaP, PbO, CdS, CdTe, ZnS, GaAs, InGaAs, Si, Ge, PbS, InSb, InGaP, AlInP, AlGaN, AlN, Ga2O3, BN, MOFs, COFs, composites, Perovskites and combinations thereof may also be incorporated.

In another embodiment, the beta voltaic device is made up of silica covered scintillating particles incorporated within an isotope absorbing layer, and a semiconductor. The scintillating particles may include a material selected from the group consisting of BaF2, Br—La—Ce-halides (Cl, Br, etc), perovskites inorganic, and combinations thereof. The semiconductor may include a material selected from the group consisting of CVD-Diamond, SiC, GaN, GaP, PbO, CdS, CdTe, ZnS, GaAs, InGaAs, Si, Ge, PbS, InSb, InGaP, AlInP, AlGaN, AlN, Ga2O3, BN, MOFs, COFs, Perovskites and combinations thereof. The isotope absorbing layer may include a material selected from the group consisting of Tritium, Si-32, P-32, P-33, S-35, Sc-46, Co-60, Ni-63, Kr-85, Sr-90/Y-90, Ru-106, Cs-134, Cs-137, Ce-144, Pm-147, Tb-160, Tm-170, Au-198, Th-204 and combinations thereof.

In one of these arrangements, the scintillating particles comprise barium fluoride. The semiconductor material comprises GaN. The isotope absorbing layer comprises tritiated water and the silica covering is glass. As described later in the detailed description this configuration provides a variety of advantages in size and power deployment and density that are thus far unknown. While this arrangement is shown and described various additional configurations and permutations of these arrangements may be alternatively constructed so as to meet the particular needs of a user based upon their specific application.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the disclosure of the application, which is measured by the claims, nor is it intended to be limiting as to the scope of the disclosure in any way.

Various advantages and novel features of the present disclosure are described herein and will become further readily apparent to those skilled in this art from the following detailed description. In the preceding and following descriptions I have shown and described only the preferred embodiment of the disclosure, by way of illustration of the best mode contemplated for carrying out the disclosure. As will be realized, the disclosure is capable of modification in various respects without departing from the disclosure. Accordingly, the drawings and description of the preferred embodiment set forth hereafter are to be regarded as illustrative in nature, and not as restrictive.

DETAILED DESCRIPTION

Figure 1:
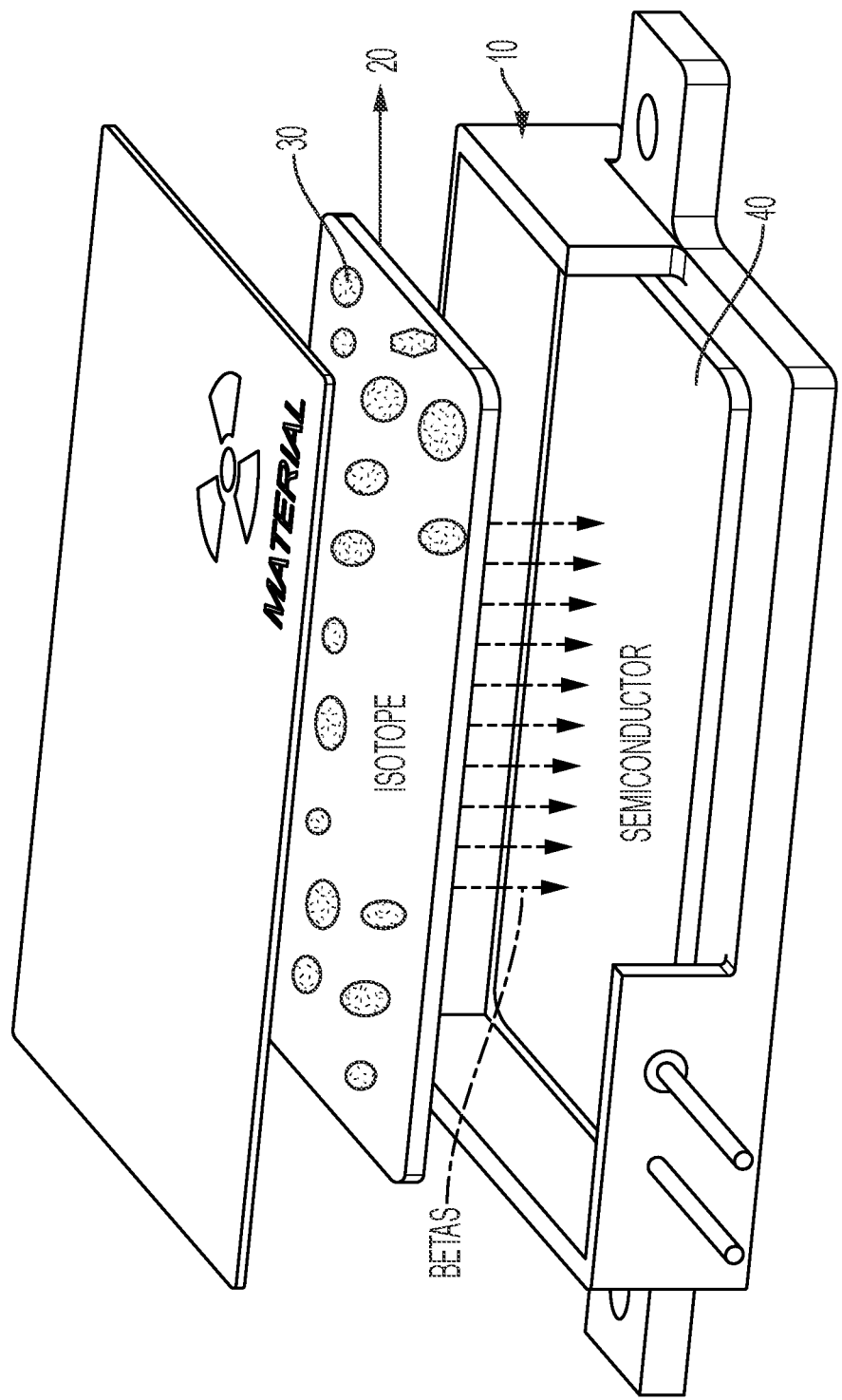
FIG. 1 shows a perspective schematic view of one embodiment of the present disclosure.

The following description includes a preferred best mode of one embodiment of the present disclosure. It will be clear from this description of the disclosure that the disclosure is not limited to these illustrated embodiments but that the disclosure also includes a variety of modifications and embodiments thereto. Therefore, the present description should be seen as illustrative and not limiting. While the disclosure is susceptible of various modifications and alternative constructions, it should be understood, that there is no intention to limit the disclosure to the specific form disclosed, but, on the contrary, the disclosure is to cover all modifications, alternative constructions, and equivalents falling within the spirit and scope of the disclosure as defined in the claims.

While various preferred embodiments of the disclosure are shown and described, it is to be distinctly understood that this disclosure is not limited thereto but may be variously embodied to practice within the scope of the following claims. From the foregoing description, it will be apparent that various changes may be made without departing from the spirit and scope of the disclosure as defined by the following claims.

Betavoltaics (BV)s are long-life (decades) power sources with the typically poor conversion of radioisotopes to electricity. For example, typical conversion efficiencies are below the single digits with high-quality devices in the single digits (0.1-5%). In most BVs, power is lost inside the radioisotope source itself due to factors such as self-shielding and reabsorption. The following provides a description of one example of a new design wherein silica covered scintillating particles are placed inside the radioisotope's source. These scintillating particles convert radiation, which is currently wasted, into photons matched to a semiconductor conversion device. In this way, the conversion efficiency of the BV device can be increased by up to 60% (for the overall efficiency of ~7%). This provides a new method to compensate for lost radiation and shrink the final volume of the devices. This in turn can lead to other advancements in the field and help bring BV devices to market by providing increased power/device volume.

In the past, highly active sources were used to compensate for poor conversion efficiency. These platforms are a good proof of concepts but are big and bulky (similar to a lithium-ion battery) As power needs to move to more and more delicate platforms, highly efficient radioactive sources are needed to enable small chip-like power that fit within slim packages and does not have many emissions from the power source over the decade+ long operation time. Among the proposed applications for such devices are single sensor and pulsed power sources (nW-mW) that operate on the decades time scale. In addition, the ability to harness BV's long-lasting power opens a broad range of applications that are not currently available. Coupled with very low power electronics BVs can be utilized in a number of applications including interconnected applications often referred to as the internet of things.

Figure 2:
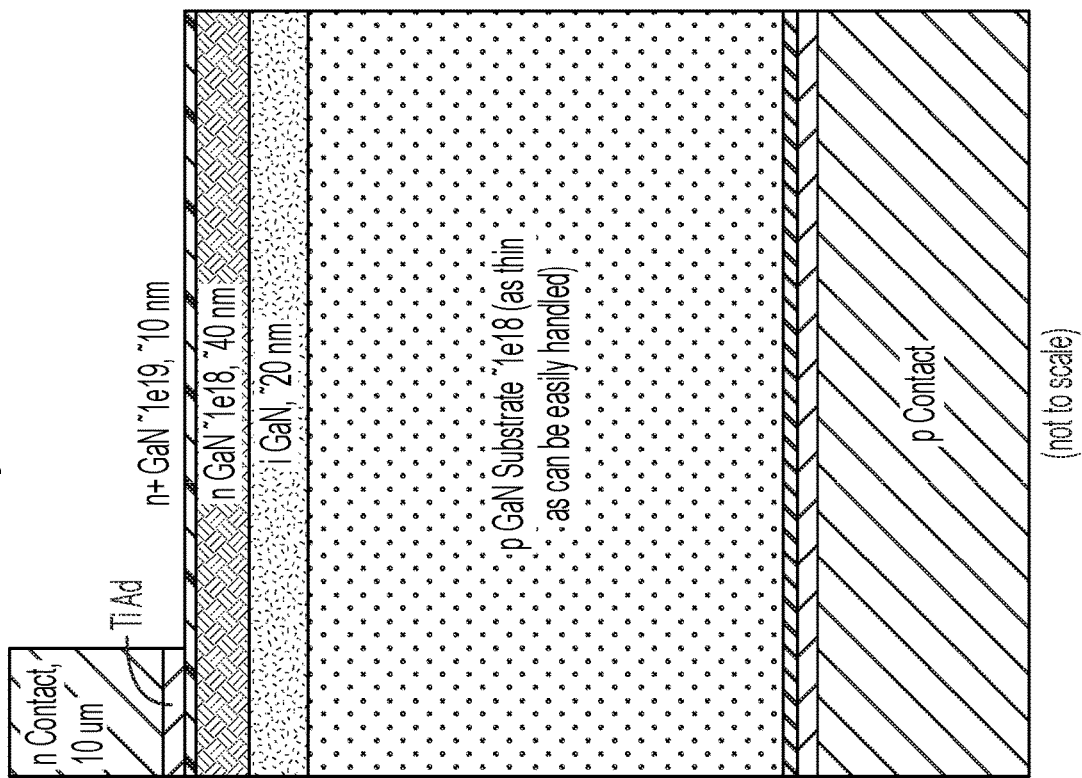
FIG. 2 shows a cutaway side schematic view of another embodiment of the present disclosure.
Figure 2:
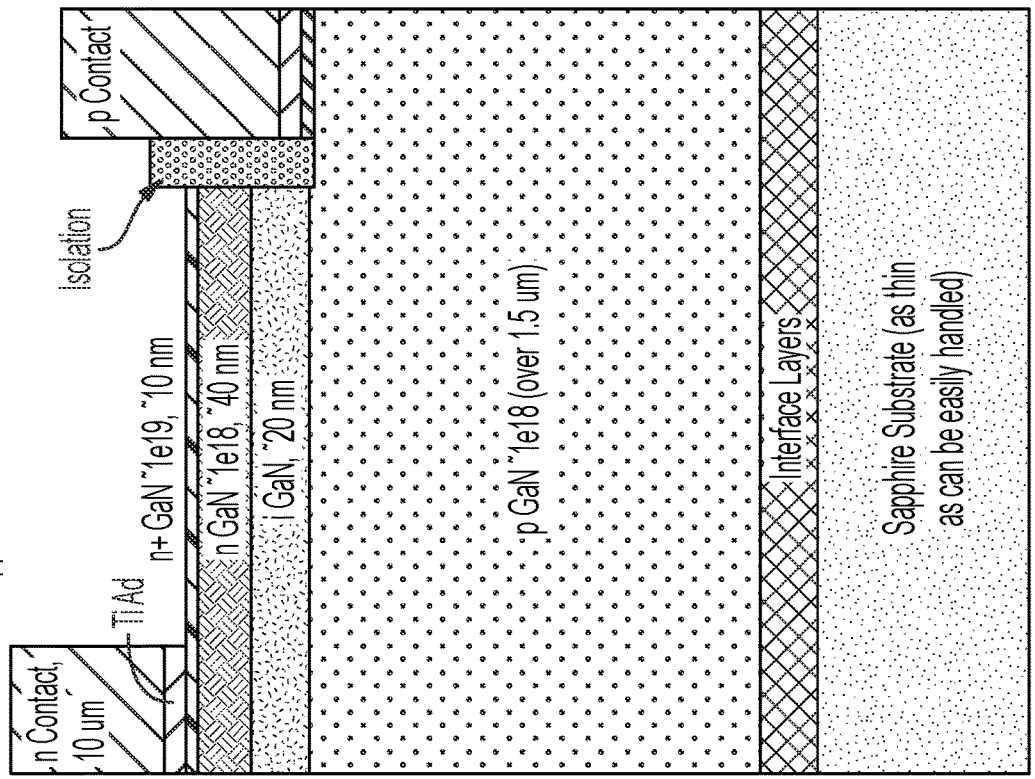
Figure 3:
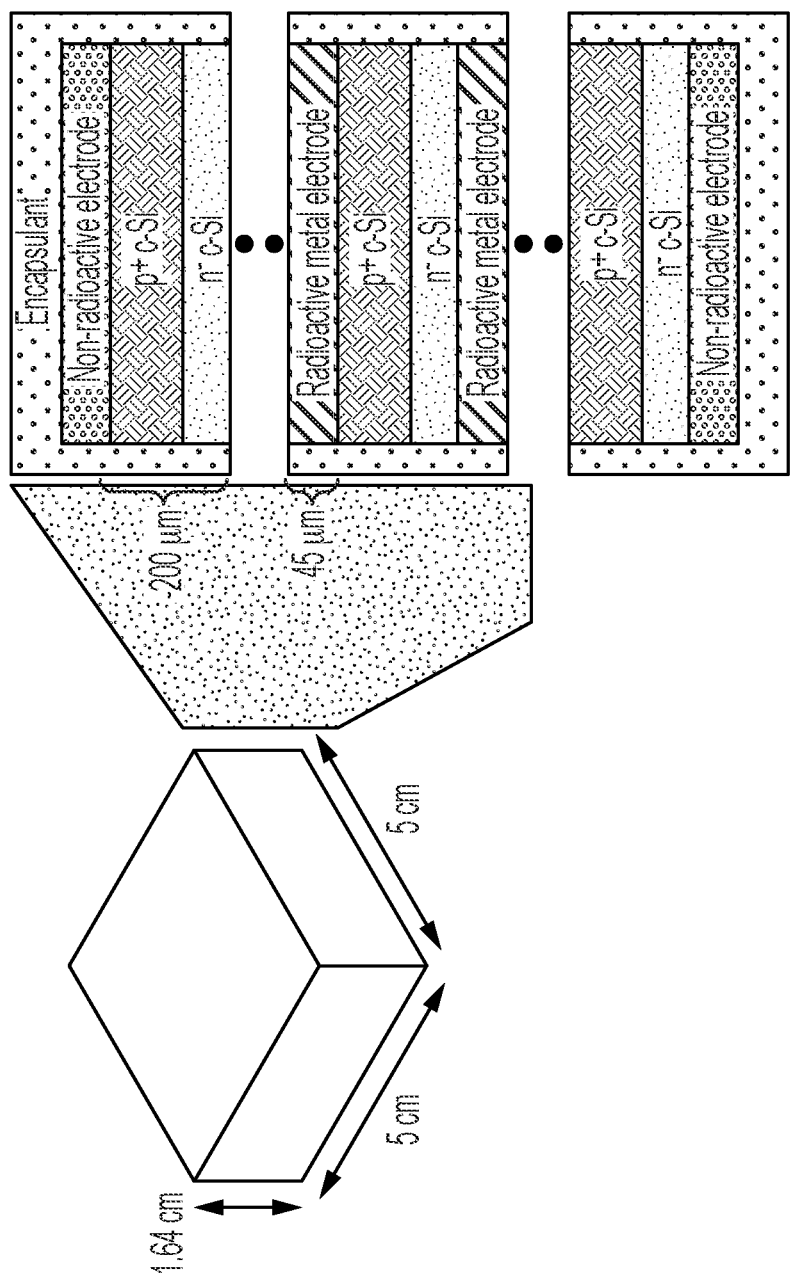
FIG. 3 shows a perspective, cutaway, schematic view of another embodiment of the present disclosure.

FIGS. 1-3 show various embodiments of the present invention. Referring now first to FIG. 1, a simplified schematic example is shown wherein scintillating particles 30 are placed inside the radioactive source layer 20 to increase the conversion efficiency of the BV device 10. In some embodiments a semiconductor 40 is also included. In use, beta particles interact with scintillation materials which provide additional UV radiation to the semiconductor this enhancing the efficacy of the system. The silica coating (preferably glass) over the scintillating particles lengthens their durability and efficacy. FIGS. 2 and 3 show other embodiments of this same principle adapted for various other specific arrangements.

As an initial demonstration of the principle in the arrangement such as the one shown in FIG. 1, barium fluoride ($BaF_2$) was selected as the scintillating particle. Barium fluoride has an inherent brightness, is commercially available as a powder, and has a spectral match to gallium nitride which was used as the semiconductor in this embodiment. The light emissions from irradiated $BaF_2$ absorbed within the depletion region of a GaN semiconductor, thus contributing to the EHP generation of the semiconductor device.

The $BaF_2$ particles were covered in glass by a modified Stober method. The particles were silica covered to protect the salt-based scintillator from dissolving in the tritiated water. The particles were then mixed into the tritiated water's absorber layer to maximize efficiency. In one embodiment the absorber layer was ~90% super absorbent polymer, and ~10% radiation resistant superhydrophilic MOF to maximize space for tritium while preserving some radiation hardness. The particles scintillate UV light which can then be absorbed into the GaN. In some arrangements, reflectors are placed on the opposing sides of the radioactive source to reflect UV light, thus minimizing the package volume and eliminating the need for a $2^{nd}$ conversion device.

(See FIGS. 2 and 3) By incorporating the silica covered particles and the reflector into the radioactive source, the waste radiation is utilized and the overall conversion efficiency augmented while minimizing the device volume.

In use the silica coated scintillating particles convert waste radiation into usable UV light. The following calculation demonstrates the gains inherent by using the coated particles: For purposes of the calculation, scintillating particles are added to the device from the need section, each particle is about a micron in diameter. This matches the maximum penetration depth of the tritium beta particles in $BaF_2$ to not loose light in the particle. As the maximum penetration of the beta particles in the above system is 10 microns, it is assumed that the average emission length is ~5 microns in length. If the beta particles are traveling an average of 5 microns before reabsorption into the host matrix, then the particles need to be spaced less than 5 microns apart in the host matrix to approximately match the average interaction distance of the beta particles.

As a first pass on the concentration of particles needed: assuming the particles are to be spaced 5 microns apart (on average), there are about 125 cubic microns of tritiated water in the volume. A particle occupies about 0.5 cubic microns of volume. By dividing these two values, the ratio of 0.42% vol is needed to ensure that many of the beta particles are interacting with the scintillator, while still maximizing the room available for tritium radioisotopes. As all of these calculations are the first pass the optimal concentration of particle will likely be higher than that above, but this is a good initial guess for the system. Barium fluoride makes about 12 photons per keV of irradiation. That means for tritium's beta at 5.7 keV about 68 photons are produced per decay. If a tritium source containing 100% tritiated water in super absorbent polymer/MOF is assumed, then 3.1e10 betas/cm²/s are lost in the radioactive source and are available for converting to UV light. This then corresponds to 2.1e12 photons/cm² that can be produced from the scintillating particles. The overall efficiency for UV generation and transmission out of the source is envisioned to be from 10-60% of the photons are emitted to the GaN. That signifies that there are 2e11 to 1.3e12 photons/cm²/s emitted onto the GaN.

Using code from literature (https://doi.org/10.1557/adv.2020.6) there are about 2.1e11 EPHs/cm² generated in the depletion region of the BV device. The UV light has the potential to produce 2.1E10 to 1.3E11 EHPs/cm² in the same region. These values correspond to a power increase of 9 to 60% over the base value (with an expected value from 18-21% increase) by dividing the 2 EHP generation rates. This is a significant power increase and has the potential to greatly extend the life of the device at the same time as increasing the power output. These gains are expected to take place without adding additional volume to the final device package. This work has the potential to drastically increase the conversion efficiency of BV devices, enabling their deployment and commercialization as a decade's long power source for on-chip and pulsed power applications.

In another arrangement, the absorber layer coating contains 50-90% wt. super absorbent polymer (PACA-K), 40-49% superhydrophilic MOF (e.g., Al, Zr, Zn based MOFs)) and the balance glass covered barium fluoride scintillator. The absorbent properties of the MOF may be engineered to make a rad hard layer that would last the full lifetime of the isotope. The coating has been applied by the doctor blading the polymer with non rad water and then vacuumed dried prior to silver pasting and soldering.

Initial testing with a 350 nm LED controlled to produce 2× the photons that the tritium is going to produce in electron-hole pairs was conducted to determine if the barium fluoride particles were contributing to power generation. The chip uncoated made 25-31 µW, coated with PACA-K the chip made 27-33 µW, and with 1% by weight scintillator particles made 41-45 µW. This corresponds to about a 25% increase in power generation, which would be expected to produce 12% power increase in the case of the tritium.

Tritium emits a beta particle at an average value of 5.7 keV. If one assumes the tritiated water is as thick as a thin droplet on a surface (~10 um), then only 16.1% of the beta energy is emitted from the source (https://doi.org/10.1557/adv.2020.6). While this efficiency can be doubled by placing a $2^{nd}$ conversion divide on the opposite side of the radioactive source, this calculation entails just 1 converter for simplicity's sake. The emission leaves about 84% of the energy wasted in the radioactive source (tritiated water). This is the largest area for improvement, but the following conversion calculation is needed for the overall efficiency.

The Klein relationship (https://aip.scitation.org/doi/pdf/10.1063/1.1656484) relates the ionization energy of the radiation to the semiconductor. GaN has a bandgap of 3.4 eV which corresponds to ~10 eV of ionization energy. This means that the beta from tritium makes on average 570 electron-hole pairs (EHPs) (5700 eV/10 eV). Each of these 10 eV EHPs must lose energy to be conducted out of the GaN. The GaN conducts electrons at 3.4 eV so the automatic absorption efficiency of the semiconductor is 34% (3.4 eV/10 eV).

Combining the above two conversion factors an overall efficiency of 5.5% is achieved (16.1%*34%). The above calculations exemplify losses due to physics and do not consider any packaging or geometric losses inherent to device construction, thus the 5.5% is the maximum theoretical efficiency for the proposed device. While this provides an initial arrangement there is space for additional improvement, and anything which increases the conversion efficiency is a welcome advance to the state of the art.

While various preferred embodiments of the disclosure are shown and described, it is to be distinctly understood that this disclosure is not limited thereto but may be variously embodied to practice within the scope of the following claims. From the foregoing description, it will be apparent that various changes may be made without departing from the spirit and scope of the disclosure as defined by the following claims.

We claim:

1. A beta voltaic device comprising:
   silica covered scintillating particles incorporated within an isotope absorbing layer to produce an improved power source.

2. The beta voltaic device of claim 1 wherein the scintillating particles comprise a material selected from the group consisting of $BaF_2$, Br—La—Ce-Halides, Perovskites, Inorganics, MOFs, COFs and their composites and combinations thereof.

3. The beta voltaic device of claim 1 wherein the isotope absorbing layer comprises a material selected from the group consisting of: Tritium, Si-32, P-32, P-33, S-35, Sc-46, Co-60, Ni-63, Kr-85, Sr-90/Y-90, Ru-106, Cs-134, Cs-137, Ce-144, Pm-147, Tb-160, Tm-170, Au-198, Th-204 and combinations thereof.

4. The beta voltaic device of claim 1 wherein the silica covering is glass.

5. The beta voltaic device of claim 1 further comprising a semiconductor.

6. The beta voltaic device of claim 5 wherein the semiconductor is selected from the group consisting of CVD-Diamond, SiC, GaN, GaP, PbO, CdS, CdTe, ZnS, GaAs, InGaAs, Si, Ge, PbS, InSb, InGaP, AlInP, AlGaN, AlN, Ga2O3, BN, Perovskites, MOFs, COFs, composites and combinations thereof.

7. A beta voltaic device comprising:
   silica covered scintillating particles incorporated within a tritiated water isotope absorbing layer to produce an improved power source.

8. The beta voltaic device of claim 7 wherein the scintillating particles are selected from the group consisting of BaF2, Br—La—Ce-Halides, Perovskites Inorganic, and combinations thereof.

9. The beta voltaic device of claim 8 wherein the silica covering is glass.

10. The beta voltaic device of claim 9 further comprising a semiconductor.

11. The beta voltaic device of claim 10 wherein the semiconductor is selected from the group consisting of CVD-Diamond, SiC, GaN, GaP, PbO, CdS, CdTe, ZnS, GaAs, InGaAs, Si, Ge, PbS, InSb, InGaP, AlInP, AlGaN, AlN, Ga2O3, BN, Perovskites and combinations thereof.

12. A beta voltaic device comprising:
    silica covered scintillating particles incorporated within an isotope absorbing layer, and
    a semiconductor.

13. The beta voltaic device of claim 12 wherein the scintillating particles comprise a material selected from the group consisting of BaF2, Br—La—Ce-Halides (Cl, Br, etc), Perovskites Inorganic, and combinations thereof.

14. The beta voltaic device of claim 13 wherein the semiconductor comprises a material selected from the group consisting of CVD-Diamond, SiC, GaN, GaP, PbO, CdS, CdTe, ZnS, GaAs, InGaAs, Si, Ge, PbS, InSb, InGaP, AlInP, AlGaN, AlN, Ga2O3, BN, Perovskites, MOFs, COFs, inorganic frameworks and combinations thereof.

15. The beta voltaic device of claim 14 wherein the isotope absorbing layer comprises a material selected from the group consisting of Tritium, Si-32, P-32, P-33, S-35, Sc-46, Co-60, Ni-63, Kr-85, Sr-90/Y-90, Ru-106, Cs-134, Cs-137, Ce-144, Pm-147, Tb-160, Tm-170, Au-198, Th-204 and combinations thereof.

16. The beta voltaic device of claim 15 wherein the scintillating particles comprises barium fluoride.

17. The beta voltaic device of claim 16 wherein the semiconductor material comprises GaN.

18. The beta voltaic device of claim 17 wherein the isotope absorbing layer comprises tritiated water.

19. The beta voltaic device of claim 18 wherein the silica covering is glass.

* * * * *